US011139299B2

(12) United States Patent
Ramachandran et al.

(10) Patent No.: US 11,139,299 B2
(45) Date of Patent: Oct. 5, 2021

(54) FINFET BASED ZRAM WITH CONVEX CHANNEL REGION

(71) Applicant: International Business Machines Corporation, Armonk, NY (US)

(72) Inventors: Ravikumar Ramachandran, Pleasantville, NY (US); Reinaldo Ariel Vega, Mahopac, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 16/444,386

(22) Filed: Jun. 18, 2019

(65) Prior Publication Data
US 2019/0304980 A1 Oct. 3, 2019

Related U.S. Application Data

(62) Division of application No. 14/581,472, filed on Dec. 23, 2014, now Pat. No. 10,403,628.

(51) Int. Cl.
*H01L 29/78* (2006.01)
*H01L 29/66* (2006.01)
(Continued)

(52) U.S. Cl.
CPC .. *H01L 27/10802* (2013.01); *H01L 27/10844* (2013.01); *H01L 29/1054* (2013.01); *H01L 29/6653* (2013.01); *H01L 29/6656* (2013.01); *H01L 29/66545* (2013.01); *H01L 29/66795* (2013.01); *H01L 29/785* (2013.01);
(Continued)

(58) Field of Classification Search
CPC ............. H01L 29/66795; H01L 29/785; H01L 29/7851; H01L 29/0847; H01L 21/823431; H01L 21/845; H01L 29/7853; H01L 29/1054; H01L 29/7842; H01L 29/42376
See application file for complete search history.

(56) References Cited

U.S. PATENT DOCUMENTS 6,656,845 B2  12/2003  Lee et al.
7,728,324 B2  6/2010  Tezuka et al.
(Continued)

OTHER PUBLICATIONS

List of IBM Patents or Patent Applications Treated as Related; Date Filed: Jun. 24, 2019, 2 pages.

*Primary Examiner* — Jesse Y Miyoshi
(74) *Attorney, Agent, or Firm* — Cantor Colburn LLP; Steven Meyers (57) ABSTRACT

Embodiments of the present invention provide improved methods and structures for fabrication of capacitor-less DRAM devices, sometimes referred to as ZRAM devices. A channel is formed in a fin-type field effect transistor (finFET) that is comprised of a finned channel portion and a convex channel portion. The finned channel portion may be comprised of a first semiconductor material and the convex channel portion may be comprised of a second, different semiconductor material. In embodiments, a metal gate is disposed around the elongated surface of the channel region, but is not disposed on the short surface of the channel region. A first spacer is disposed adjacent to the gate and in direct physical contact with the short surface of the channel region, and a second spacer is disposed adjacent to the first spacer.

8 Claims, 12 Drawing Sheets

(51) Int. Cl.
*H01L 29/10* (2006.01)
*H01L 29/12* (2006.01)
*H01L 29/165* (2006.01)
*H01L 27/108* (2006.01)

(52) U.S. Cl.
CPC ........ *H01L 29/7841* (2013.01); *H01L 29/122* (2013.01); *H01L 29/165* (2013.01)

(56) References Cited

U.S. PATENT DOCUMENTS

| | | |
|---|---|---|
| 7,960,791 B2 | 6/2011 | Anderson et al. |
| 8,227,301 B2 | 7/2012 | Anderson et al. |
| 8,847,281 B2 | 9/2014 | Cea et al. |
| 8,860,109 B2 | 10/2014 | Park et al. |
| 2007/0090416 A1 | 4/2007 | Doyle et al. |
| 2008/0054361 A1 | 3/2008 | Siprak |
| 2008/0296632 A1 | 12/2008 | Moroz et al. |
| 2009/0108351 A1 | 4/2009 | Yang et al. |
| 2011/0171795 A1 | 7/2011 | Tsai et al. |
| 2012/0074386 A1* | 3/2012 | Rachmady ........ H01L 29/66431 257/24 |
| 2012/0261643 A1 | 10/2012 | Cohen et al. |
| 2012/0305893 A1 | 12/2012 | Colinge |
| 2013/0341631 A1 | 12/2013 | Maeda et al. |
| 2015/0162445 A1* | 6/2015 | Wu .................. H01L 29/66636 257/344 |

* cited by examiner

FINFET BASED ZRAM WITH CONVEX CHANNEL REGION

This application is a divisional of U.S. application Ser. No. 14/581,472, titled "FINFET BASED ZRAM WITH CONVEX CHANNEL REGION" filed Dec. 23, 2014, the contents of which are incorporated by reference herein in its entirety.

FIELD OF THE INVENTION

The present invention relates generally to semiconductor fabrication, and more particularly, to fabrication of ZRAM devices.

BACKGROUND OF THE INVENTION

Dynamic random access memory (DRAM) is utilized in many electronic devices. These include computers, mobile devices, tablets, and consumer electronics, to name a few. A continuous goal is increasing of the circuit density, thus increasing the amount of memory in a physical package. This enables increasingly powerful computing power in smaller, more portable devices. Zero capacitance random access memory (ZRAM) is a type of DRAM memory based on the floating body effect. In ZRAM, the floating body effect allows the memory cell to be built without adding a separate capacitor, as the floating body effect takes the place of the conventional capacitor. However, there are various fabrication challenges to making ZRAM devices in a reliable, and cost effective manner. It is therefore desirable to have improved structures and methods for implementation of ZRAM devices.

SUMMARY

In a first aspect, embodiments of the present invention provide a semiconductor structure, comprising: a semiconductor substrate; a semiconductor fin disposed on the semiconductor substrate; a channel region comprising: a finned channel portion; and a convex channel portion disposed around the finned channel portion, wherein the channel region comprises an elongated surface and a short surface; a metal gate disposed around the elongated surface of the channel region; a first spacer disposed adjacent to the metal gate and in direct physical contact with the short surface of the channel region; and a second spacer disposed adjacent to the first spacer.

In a second aspect, embodiments of the present invention provide a semiconductor structure, comprising: a semiconductor substrate; a semiconductor fin disposed on the semiconductor substrate; a channel region comprising: a finned channel portion; and a convex channel portion disposed around the finned channel portion, wherein the channel region comprises an elongated surface and a short surface; a metal gate disposed around the elongated surface of the channel region and the short surface of the channel region; and a spacer disposed adjacent to the metal gate.

In a third aspect, embodiments of the present invention provide a method of forming a semiconductor structure, comprising: forming a semiconductor fin on a semiconductor substrate; forming a sacrificial gate structure; forming a first spacer adjacent to the sacrificial gate structure; forming a second spacer adjacent to the first spacer; forming source/drain regions adjacent to the second spacer; removing the sacrificial gate structure; forming a convex channel region; and forming a metal gate structure.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG). Furthermore, for clarity, some reference numbers may be omitted in certain drawings.

DETAIL DESCRIPTION

Embodiments of the present invention provide improved methods and structures for fabrication of capacitor-less DRAM devices. Such devices, sometimes referred to as ZRAM devices, implement a dynamic random access memory without the use of a capacitor in each storage cell. A channel is formed in a fin-type field effect transistor (finFET) that is comprised of a finned channel portion and a convex channel portion. The finned channel portion may be comprised of a first semiconductor material and the convex channel portion may be comprised of a second, different semiconductor material. In embodiments, a metal gate is disposed around the elongated surface of the channel region, but is not disposed on the short surface of the channel region. A first spacer is disposed adjacent to the gate and in direct physical contact with the short surface of the channel region, and a second spacer is disposed adjacent to the first spacer. This arrangement can provide a structure that is compatible with replacement metal gate processes to enable increased flexibility in design and manufacture of ZRAM devices.

Figure 1A:
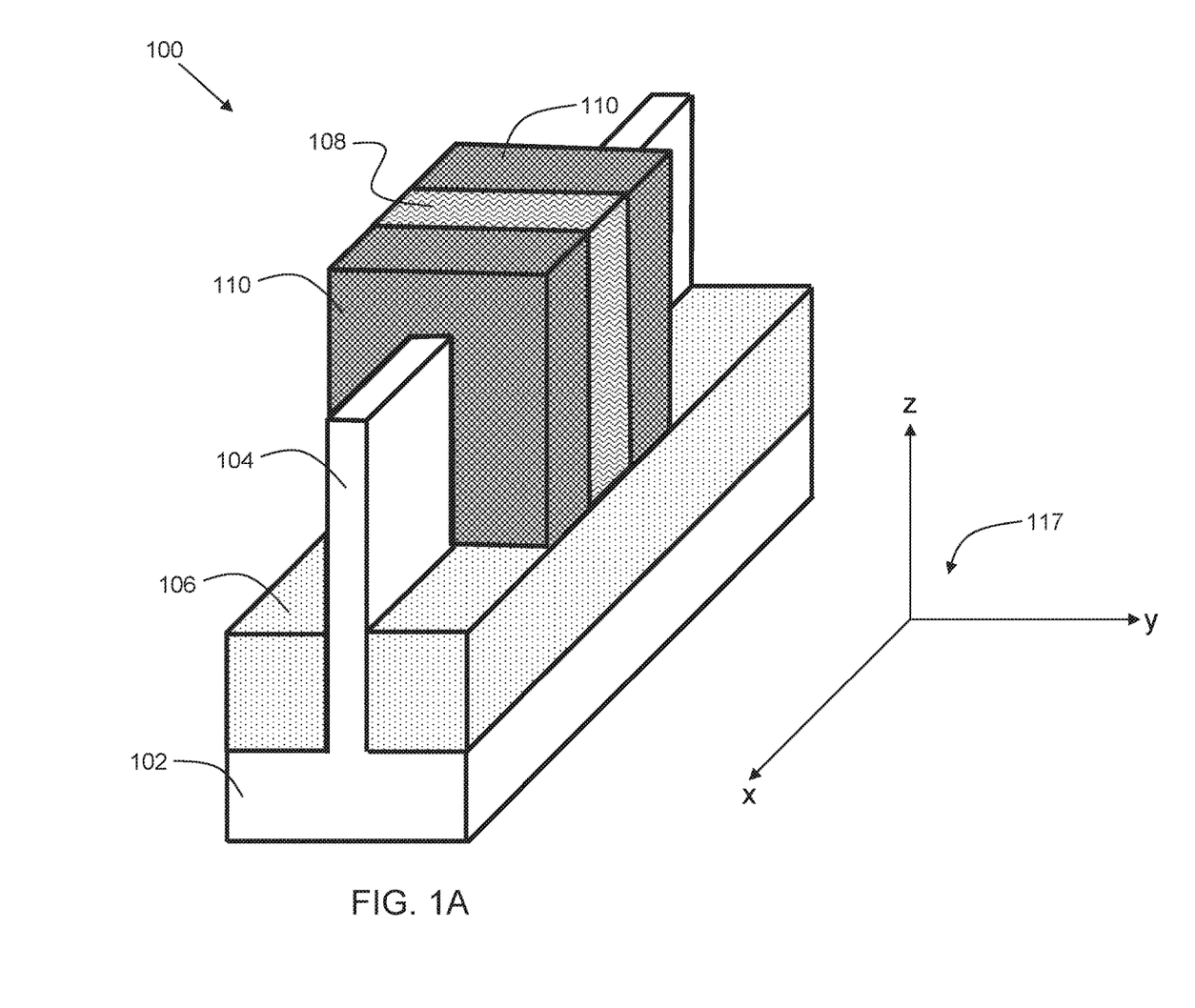
FIG. 1A shows a perspective view of an embodiment of the present invention.

FIG. 1A shows a perspective view of a semiconductor structure 100 in accordance with an embodiment of the present invention. Semiconductor structure 100 comprises semiconductor substrate 102. Substrate 102 may comprise a bulk substrate such as a silicon wafer. A local trench isolation (LTI) insulator layer 106 is disposed on the substrate 102. A semiconductor fin 104 extends from the substrate 102. A metal gate 108 is formed over the fin 104. Spacers 110 are formed on each side of gate 108. While only one set of spacers is shown in this drawing, other embodiments may have additional spacers, as is shown in other drawings.

Figure 1B:
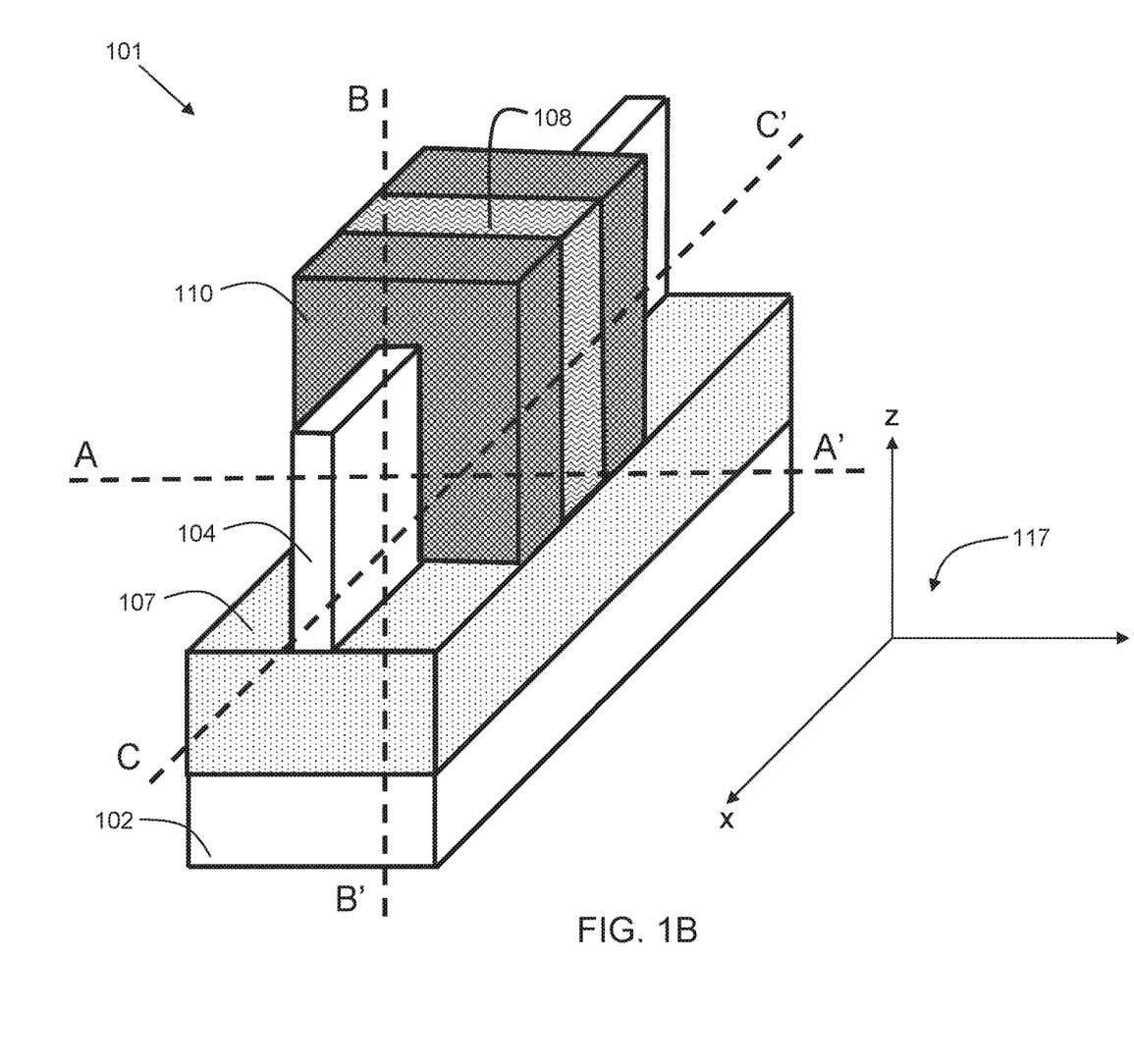
FIG. 1B shows a perspective view of an alternative embodiment of the present invention.

FIG. 1B shows a perspective view of a semiconductor structure 101 in accordance with an alternative embodiment of the present invention. Semiconductor structure 101 is similar to semiconductor structure 100 of FIG. 1B, except that semiconductor structure 101 comprises local trench isolation (LTI) insulator layer 107 that is disposed on the substrate 102, and serves to electrically isolate fin 104 from substrate 102, whereas fin 104 of semiconductor structure 100 in FIG. 1A protrudes through insulator layer 106. In embodiments, the electrical isolation of fin 104 starts with a structure such as shown in FIG. 1A. Then, a fin oxidation (FOX) process oxidizes a lower portion of fin 104, effectively converting it to oxide (e.g. silicon oxide). This can provide advantages of semiconductor-on-insulator (SOI) structures, with the reduced cost of a bulk structure. In embodiments, the FOX process includes a thermal oxidation process. In addition to the local fin oxidation as shown in FIG. 1B, embodiments of the present invention may also utilize a conventional semiconductor-on-insulator structure. FIG. 1A and FIG. 1B are intended to provide reference in the X, Y, and Z planes for the figures that follow. Legend 117 indicates the X axis, Y axis, and Z axis for these figures. Various details of the convex channel are not visible in FIG. 1A or FIG. 1B, as it is covered by the gate and spacers. Subsequent figures show various "slices" and cross sections to illustrate features of the various embodiments.

Figure 2:
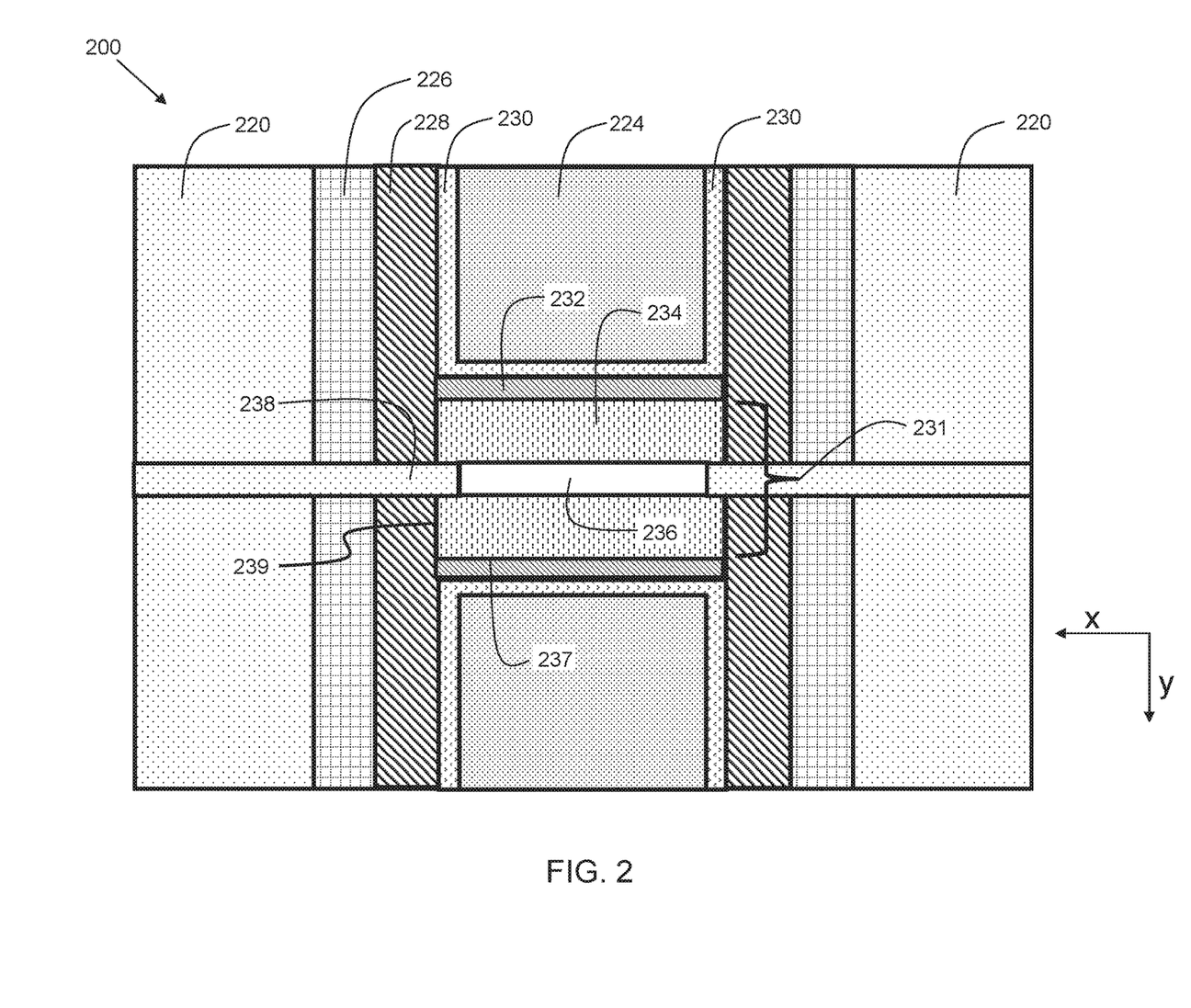
FIG. 2 shows an X-Y cross section of an embodiment of the present invention.

FIG. 2 shows an X-Y cross section of a structure 200 in accordance with an embodiment of the present invention, as viewed along line A-A' of FIG. 1B. Structure 200 includes a channel region 231 which includes finned channel portion 236 and a convex channel portion 234. The channel region 231 comprises an elongated surface 237 and a short surface 239. The convex channel portion 234 is disposed around the finned channel portion 236. A gate 224 is formed around the elongated surface 237 of the channel region 231. Disposed between the gate 224 and channel region 231 is a gate dielectric layer 230. Additionally, an oxide interlayer 232 may be disposed between the gate dielectric layer 230 and the channel region 231.

The channel region 231 is a so-called convex channel because it is wider than the fin. In embodiments, the convex channel portion 234 is comprised of silicon germanium (SiGe), and the finned channel portion 236 is comprised of silicon (which does not include germanium). In embodiments, the germanium concentration of the SiGe that comprises the convex channel portion 234 ranges from about 20 percent to about 40 percent, by atomic weight. In other embodiments, the convex channel portion 234 comprises indium phosphide (InP), and the finned channel portion 236 is comprised of silicon or silicon germanium. In other embodiments, the convex channel portion 234 comprises silicon (which does not include germanium), and the finned channel portion 236 comprises indium. In some embodiments, the finned channel portion 236 may include, but is not limited to, indium phosphide (InP), indium arsenide (InAs), and/or indium gallium arsenide (InGaAs). In other embodiments, the convex channel portion 234 comprises silicon and also includes germanium (SiGe).

A first spacer 228 is disposed adjacent to the gate 224 and in direct physical contact with the short surface 239 of the channel region 231. Thus, the gate 224 is disposed only along the elongated side of the channel region 231, and the gate does not cover the short surface 239 of the channel region 231. In embodiments, the first spacer 228 may include, but is not limited to, hafnium oxide, titanium oxide, and/or zirconium oxide. The first spacer 228 is preferably a High-K (K>4) material. A second spacer is disposed adjacent to the first spacer. In embodiments, the second spacer is comprised of silicon oxide. Disposed adjacent to the second spacer 226 is source/drain regions 220. The source/drain regions 220 may comprise an epitaxially grown semiconductor material such as epitaxial silicon or epitaxial silicon germanium. Doped extension regions 238 may extend into the channel region 231.

Figure 3:
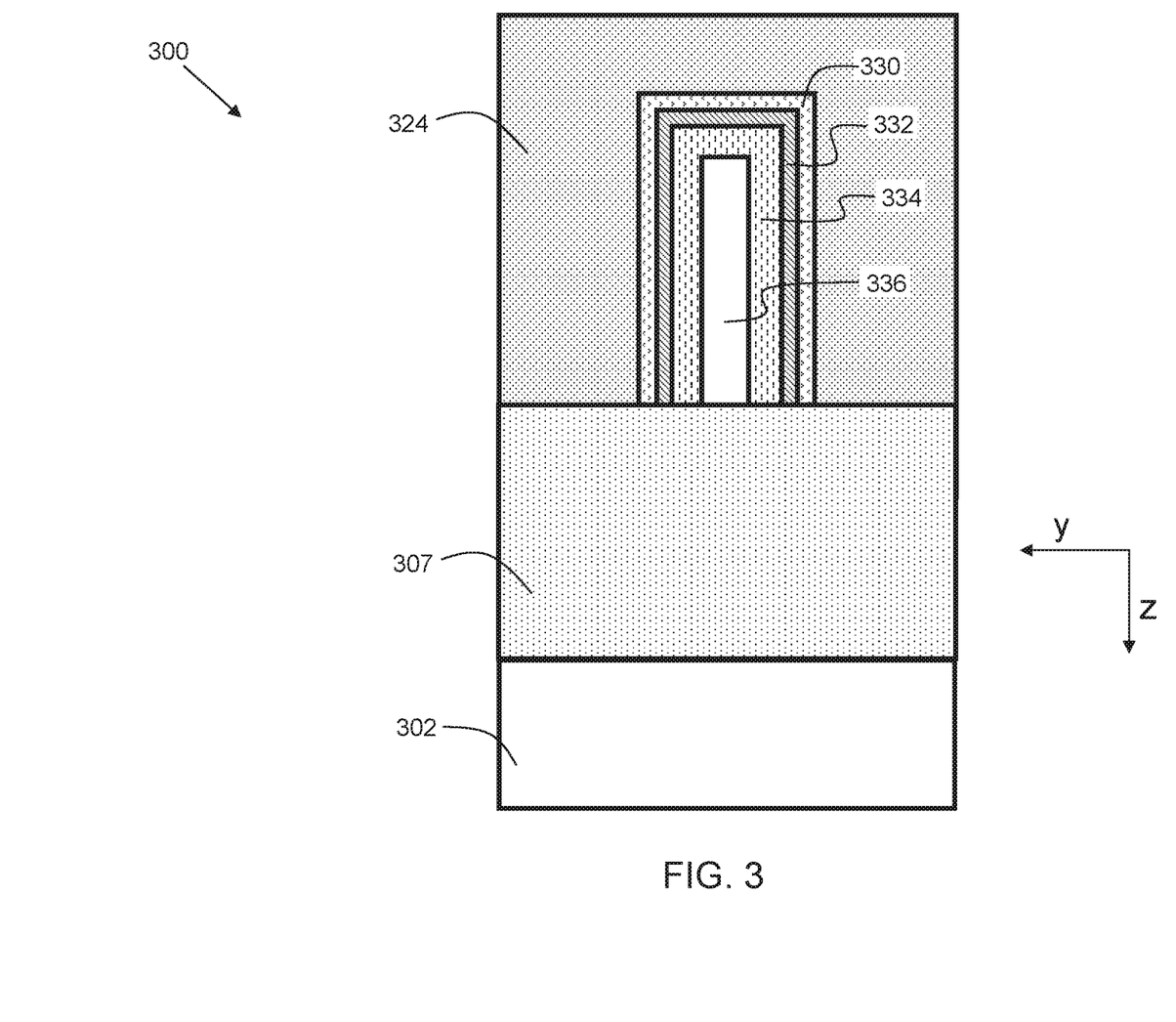
FIG. 3 shows a Y-Z cross section of an embodiment of the present invention.

FIG. 3 shows a Y-Z cross section of a semiconductor structure 300 in accordance with an embodiment of the present invention, as viewed along line B-B' of FIG. 1B. As stated previously, similar elements may be referred to by similar numbers in various figures (FIGs) of the drawing, in which case typically the last two significant digits may be the same. For example, gate 324 of FIG. 3 is similar to gate 224 of FIG. 2. In this figure, the finned channel portion 336 is isolated from substrate 302 by insulation layer 307, which may be formed by a fin oxidation (FOX) process. The convex channel portion 334 is disposed around the finned channel portion 336. An oxide interlayer 332 is disposed around the convex channel portion 334. A gate dielectric layer 330 is disposed around the oxide interlayer 332. In embodiments, the gate dielectric layer 330 is comprised of hafnium oxide, titanium dioxide, and/or zirconium oxide. Gate 324 is disposed on gate dielectric layer 330.

Figure 4:
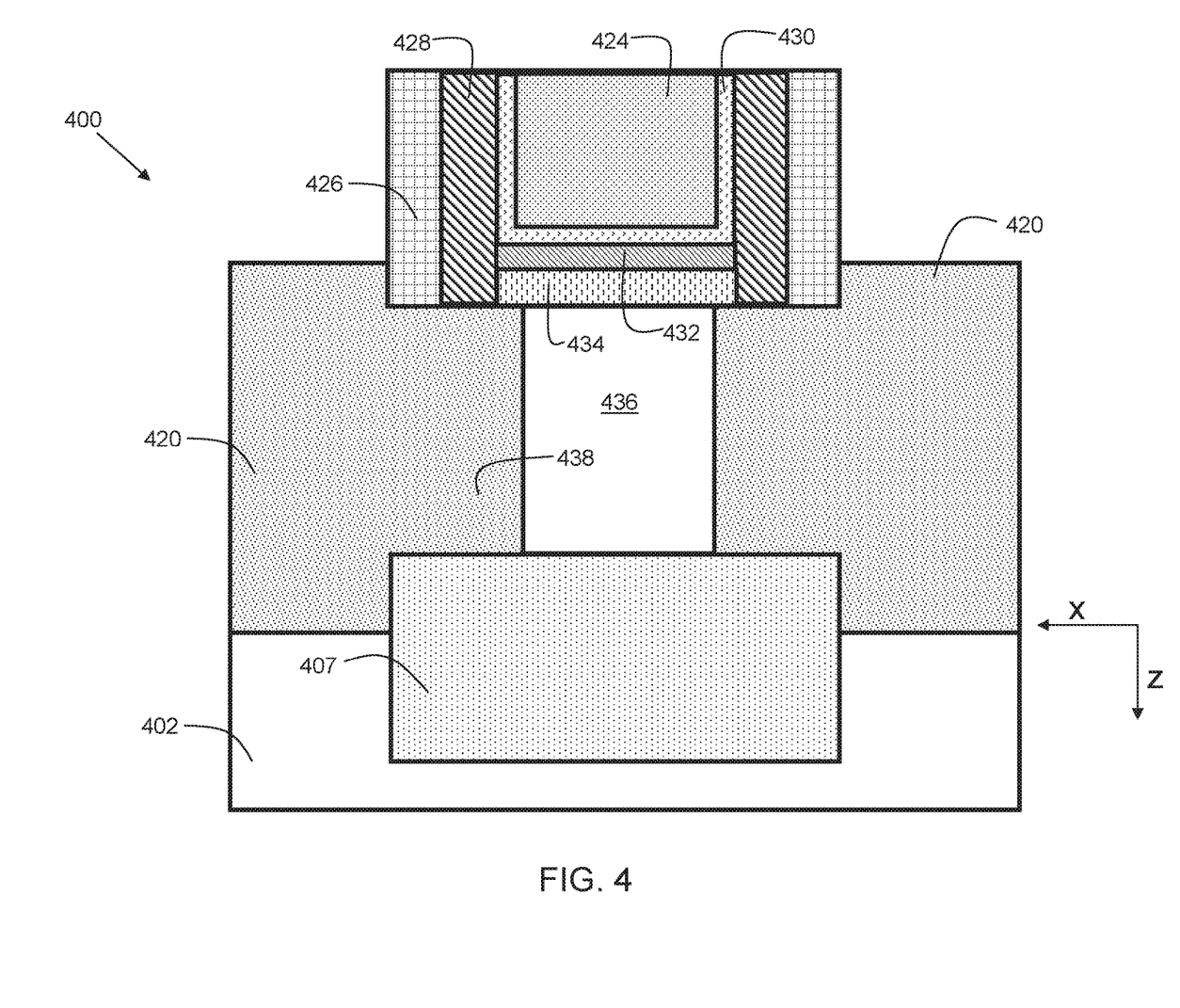
FIG. 4 shows an X-Z cross section of an embodiment of the present invention.

FIG. 4 shows an X-Z cross section of a semiconductor structure 400 in accordance with an embodiment of the present invention, as viewed along line C-C' of FIG. 1B. As shown in this view, insulation layer 407 is localized, and disposed under finned channel portion 436. In other embodiments (not shown) a standard semiconductor-on-insulator (SOI) structure may be used, in which case the insulation layer is throughout the device. In this view, it can again be seen that first spacer 428 is in direct physical contact with convex channel portion 434.

Figure 5:
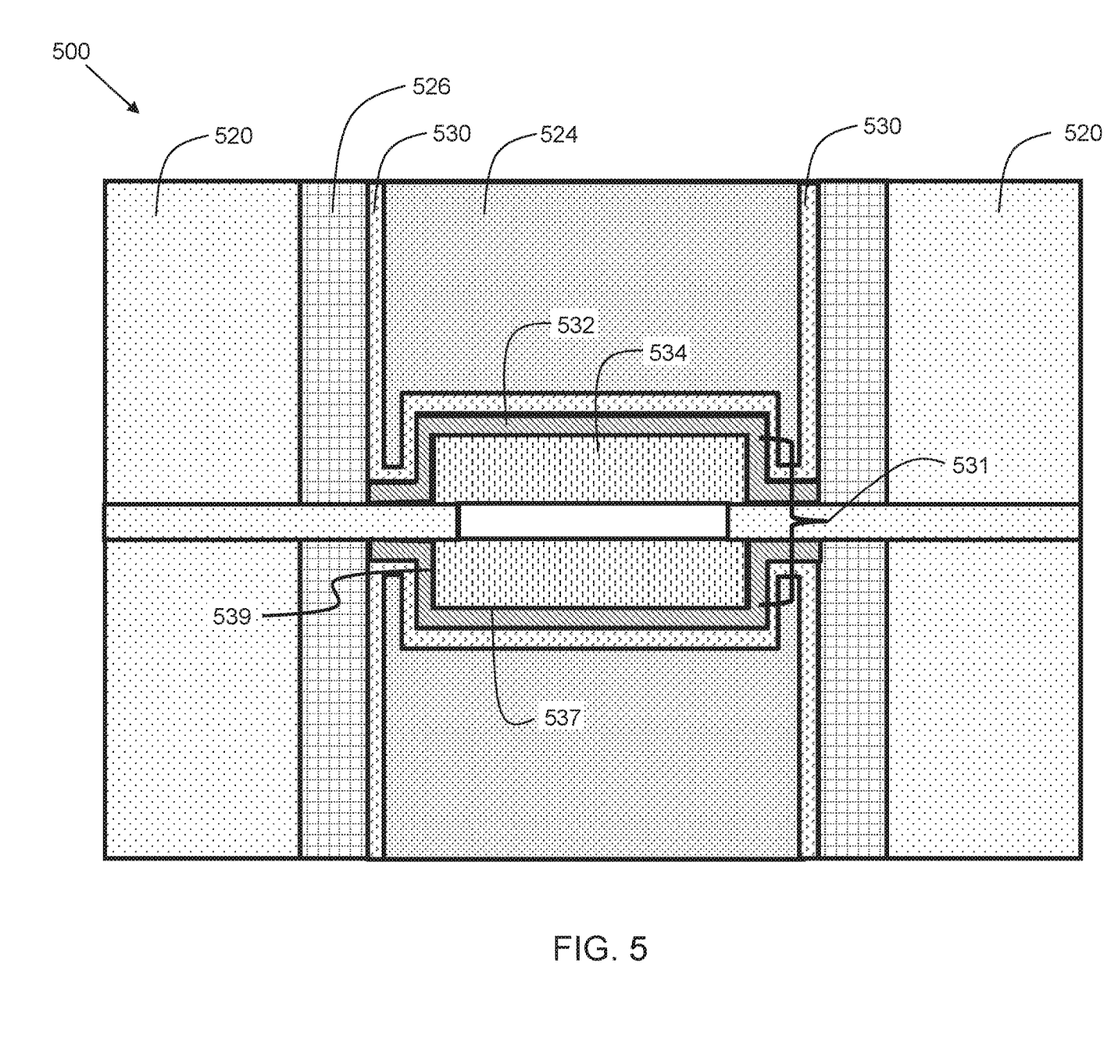
FIG. 5 shows an X-Y cross section of an alternative embodiment of the present invention.

FIG. 5 shows an X-Y cross section of a semiconductor structure 500 in accordance with an alternative embodiment of the present invention. Please refer to line A-A' of FIG. 1B for an orientation reference. In this embodiment, there is only one spacer 526, which is the outer spacer (compare with 226 of FIG. 2). The first spacer (228 of FIG. 2) is not present in this embodiment. As such, the gate 524, gate dielectric 530 and oxide interlayer 532 surround the channel region 531 on both the elongated surface 537 and the short surface 539. The channel region 531 includes a convex channel portion 534.

Figure 6:
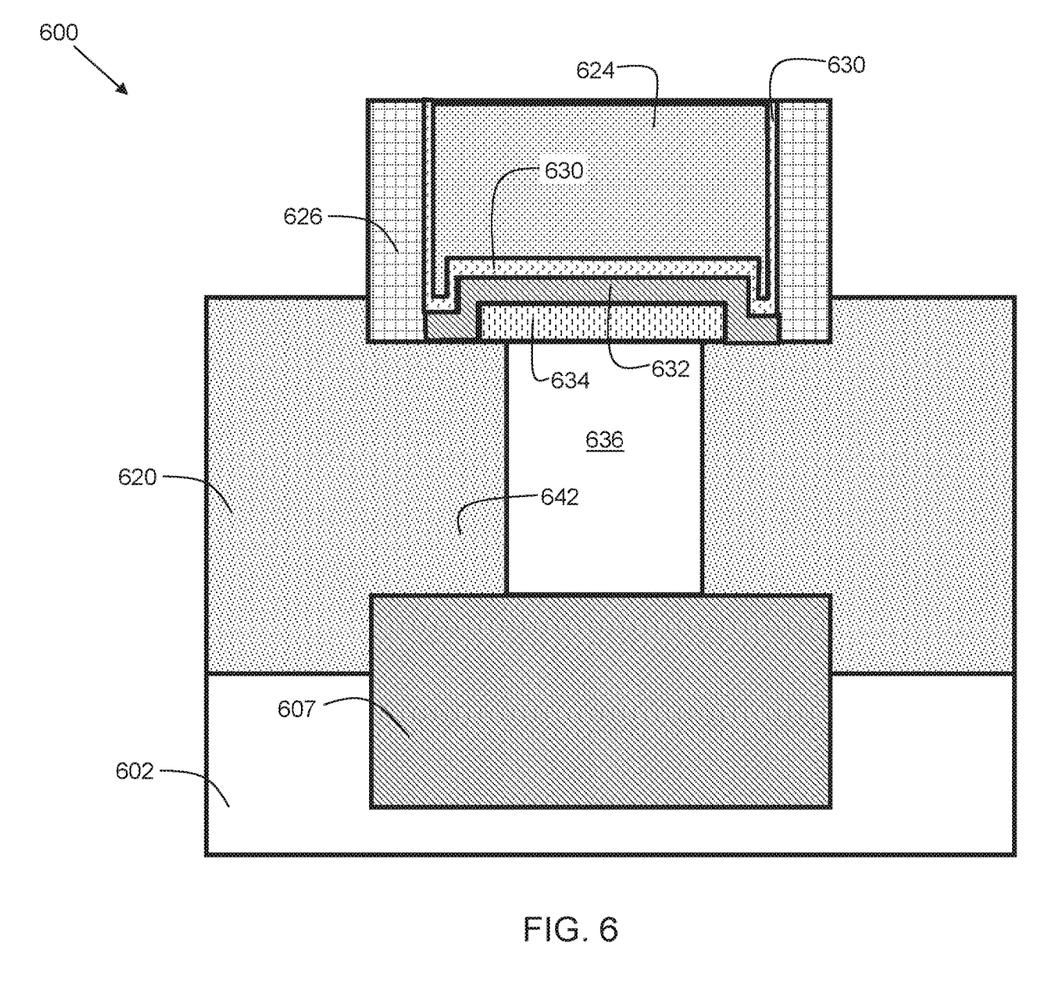
FIG. 6 shows an X-Z cross section of an alternative embodiment of the present invention.

FIG. 6 shows an X-Z cross section of a semiconductor structure 600 in accordance with an alternative embodiment of the present invention. Please refer to line C-C' of FIG. 1B for an orientation reference. As shown in this view, insulation layer 607 is localized, and disposed under finned channel portion 636. In other embodiments (not shown) a standard semiconductor-on-insulator (SOI) structure may be used, in which case the insulation layer is throughout the device. In this view, it can again be seen that spacer 626 is not in direct physical contact with convex channel portion 634. Instead, the gate 624, gate dielectric 630, and oxide interlayer 632 envelope the convex channel portion 634.

Figure 7:
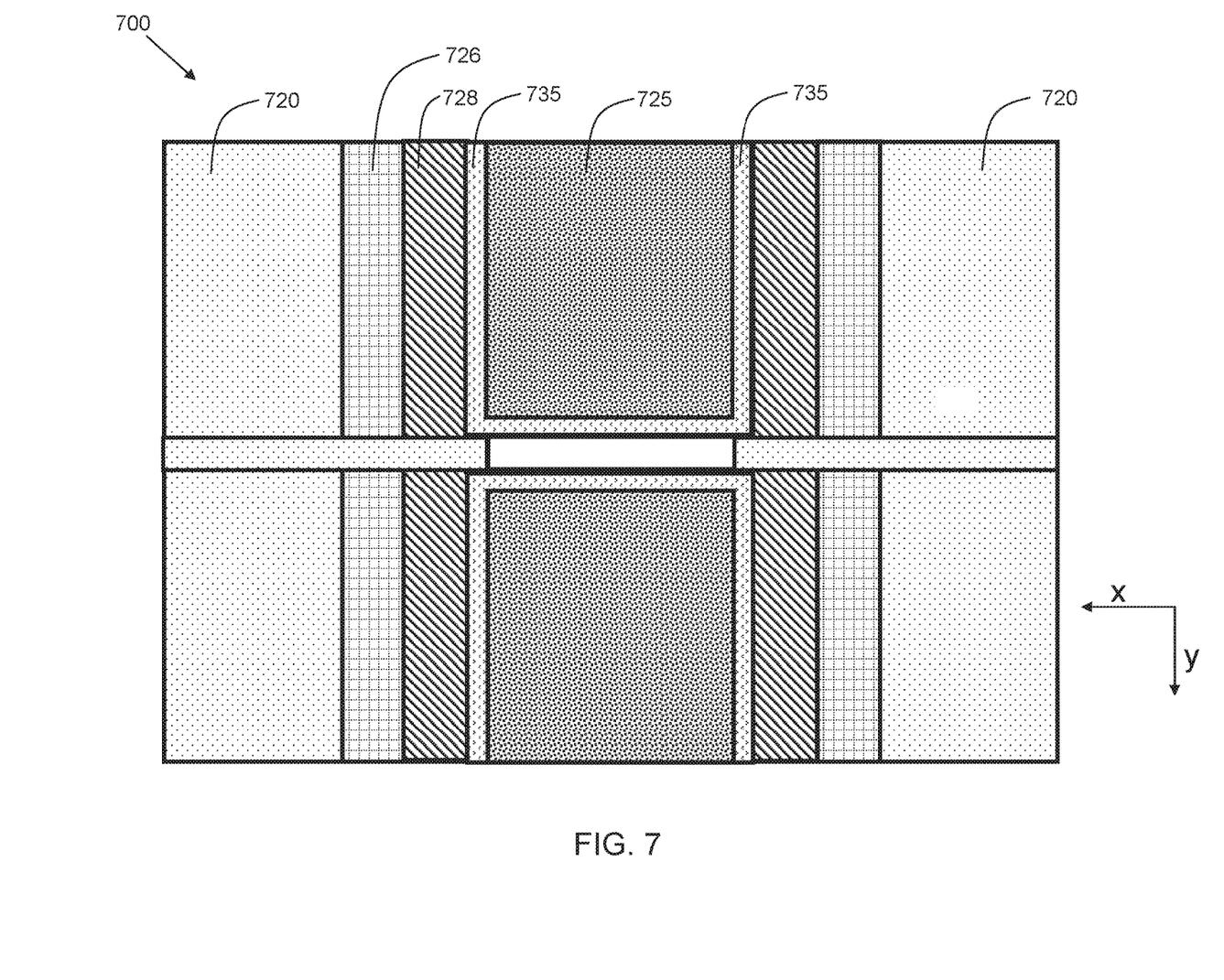
FIG. 7 shows an X-Y cross section of an embodiment at an intermediate fabrication step with dummy gates.

FIG. 7 shows an X-Y cross section of structure 700 in accordance with an embodiment at an intermediate fabrication step with dummy gate 725. A dummy gate oxide 735 may also be deposited prior to deposition of dummy (sacrificial) gate 725. In embodiments, dummy gate 725 is comprised of polysilicon. In embodiments, dummy gate oxide 735 is comprised of silicon oxide.

Figure 8A:
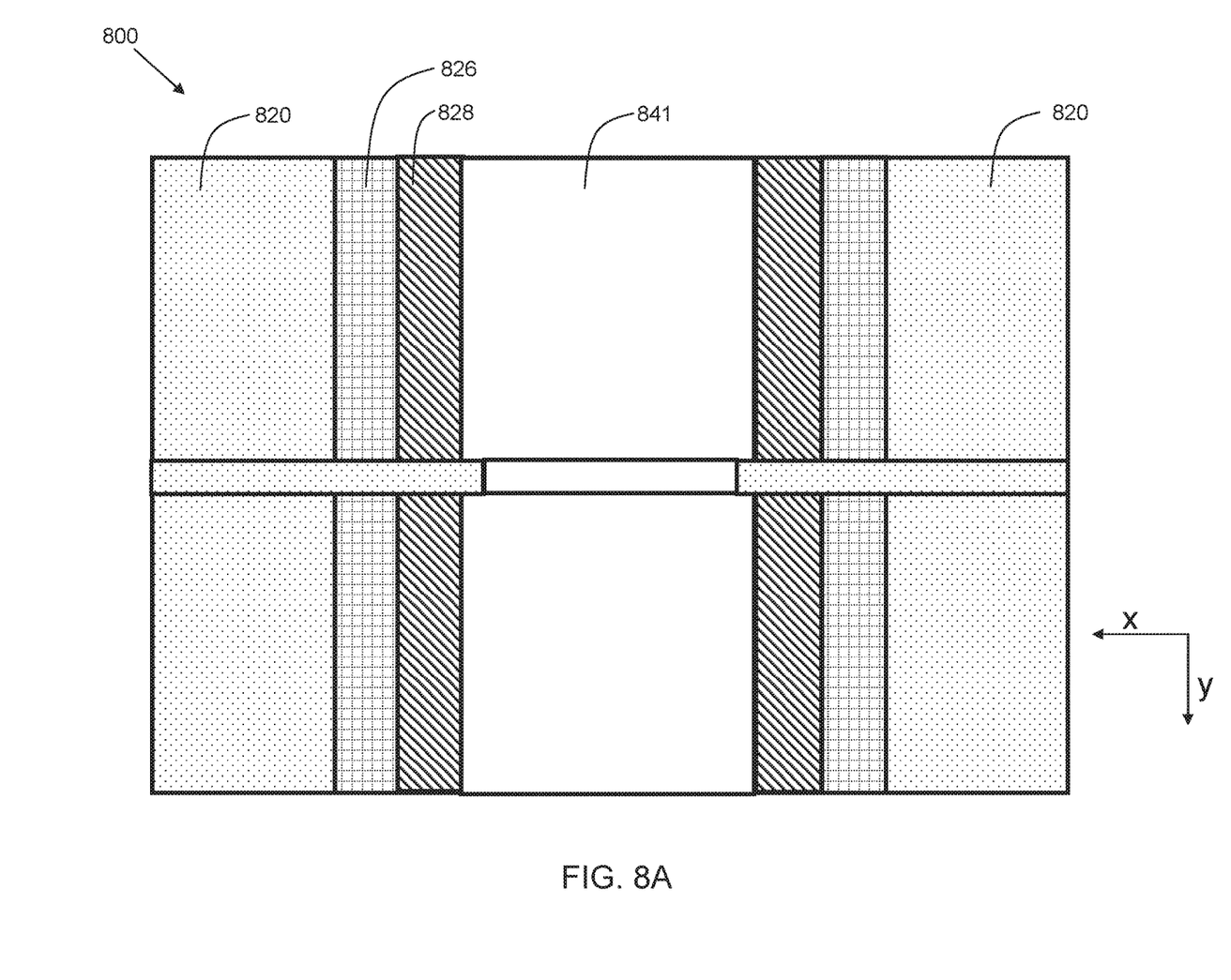
FIG. 8A shows an X-Y cross section of an embodiment after a subsequent fabrication step of dummy gate removal.
Figure 8B:
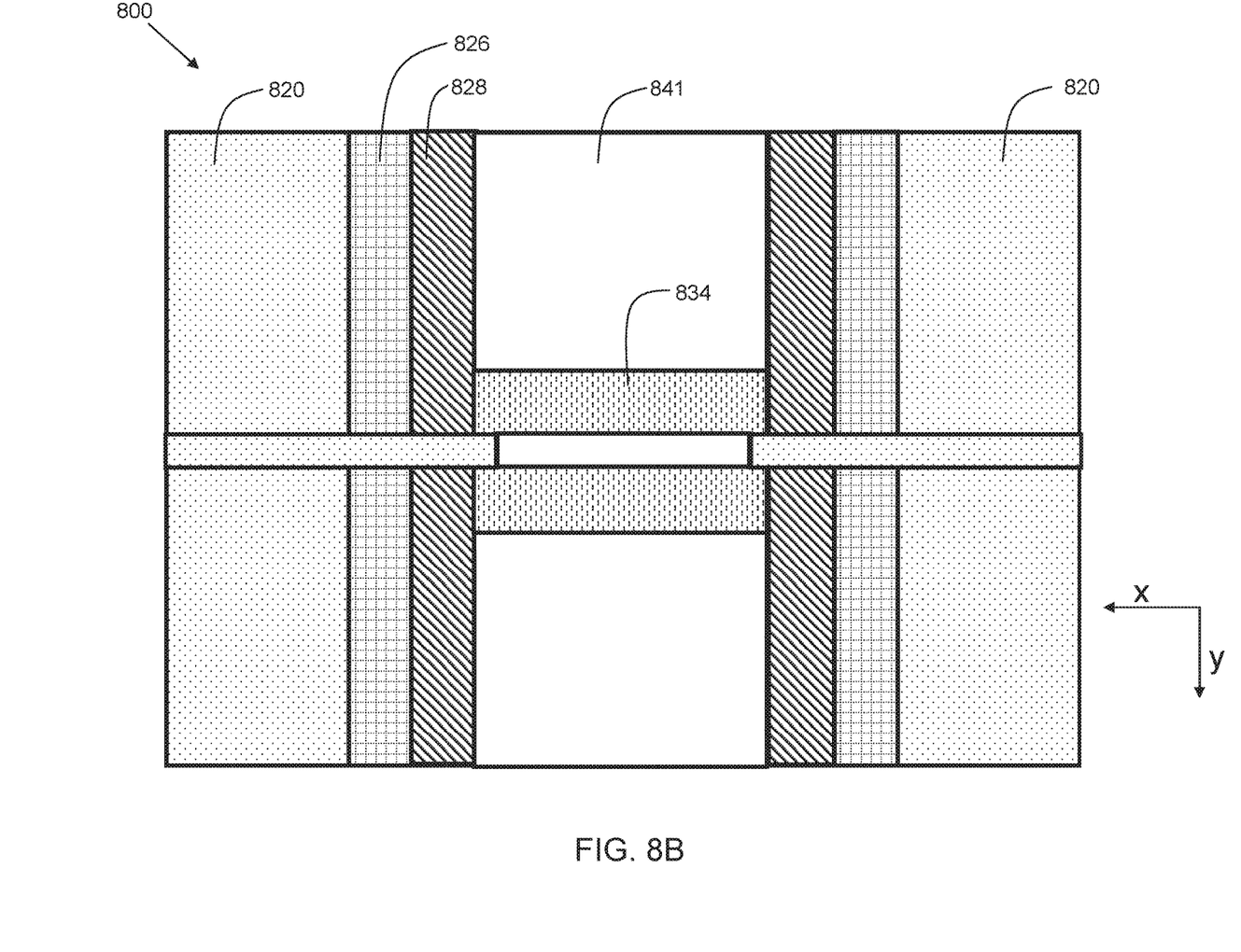
FIG. 8B shows an X-Y cross section of an embodiment after a subsequent fabrication step of forming the convex channel region.

FIG. 8A shows an X-Y cross section of structure 800 in accordance with an embodiment at a subsequent fabrication step of dummy gate removal. The dummy gate and dummy gate oxide are removed, forming void 841. FIG. 8B shows structure 800 after a subsequent process step of forming the convex channel 834. In some embodiments, a new metal gate stack, which may include gate dielectric layers, work function metals (not shown), and one or more fill metals is formed in void 841, and is thus, self-aligned to the spacers 828. Spacers 828 and spacers 826 are comprised of different materials to facilitate selective removal, if desired. In embodiments, spacers 828 are comprised of a high-K dielectric layer such as hafnium oxide, titanium oxide, and/or zirconium oxide, while spacers 826 are comprised of silicon oxide. Thus in embodiments, once the replacement metal gate (RMG) process is completed, structure 800 is then converted to a structure as depicted in structure 200 of FIG. 2. Alternatively, a wrap-around replacement metal gate process may be used, as is further explained and shown in FIG. 9.

Figure 9:
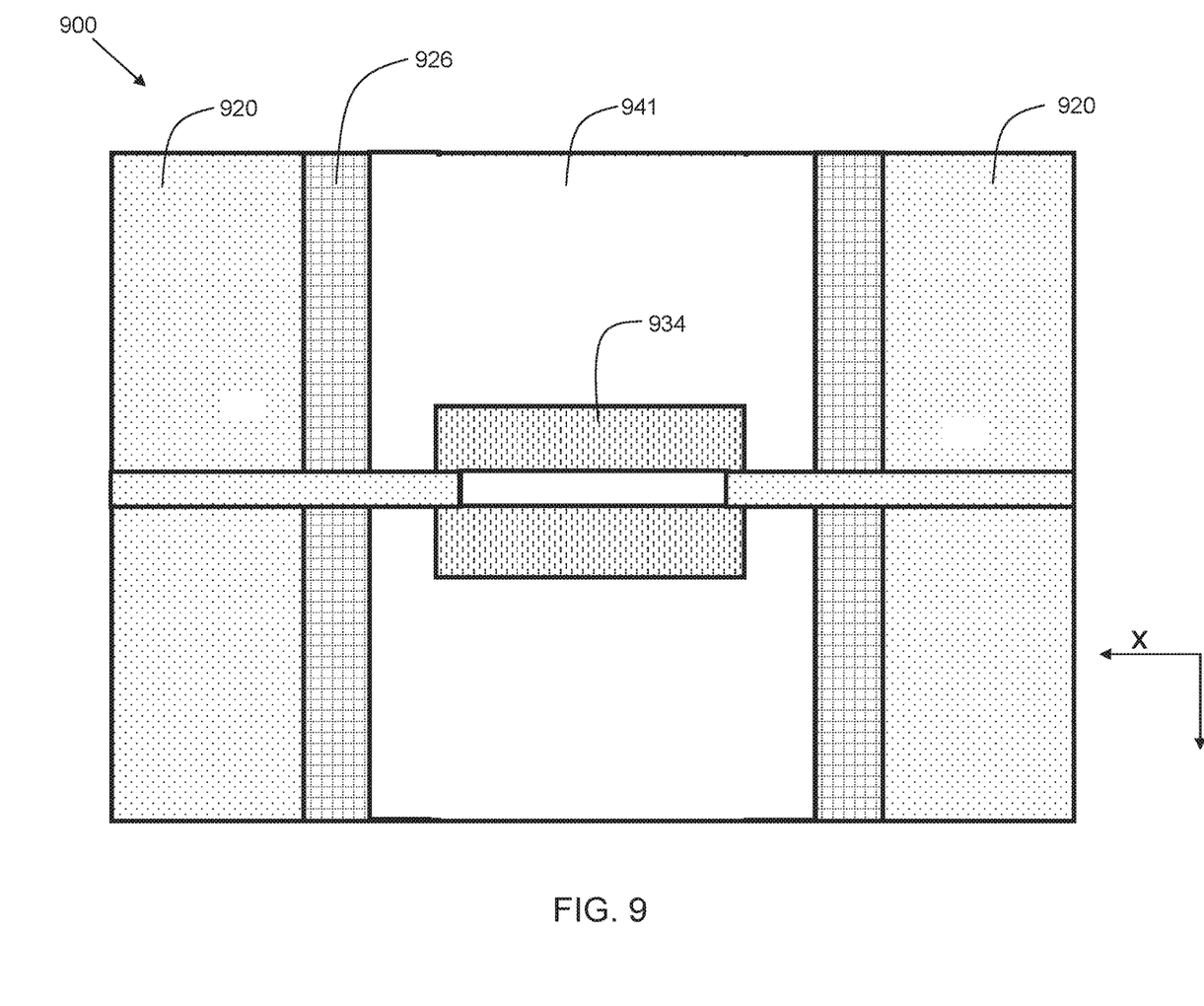
FIG. 9 shows an X-Y cross section of an embodiment after a subsequent fabrication step of first spacer removal.

FIG. 9 shows an X-Y cross section of structure 900 in accordance with an embodiment at a subsequent fabrication step of first spacer removal. The first spacers (828 in FIG. 8) are selectively removed. In embodiments, a wet etch process is used to remove the first spacers. As a result, void 941 is expanded as compared with void 841 in FIG. 8. From this point forward, a replacement metal gate process may be used, resulting in the wrap-around metal gate 524 (see FIG. 5) which envelopes both the elongated surface 537 and the short surface 539. Methods in accordance with illustrative embodiments provide the wrap-around gate in a self-aligned process, improving the ease of manufacturing and improving yield.

Figure 10:
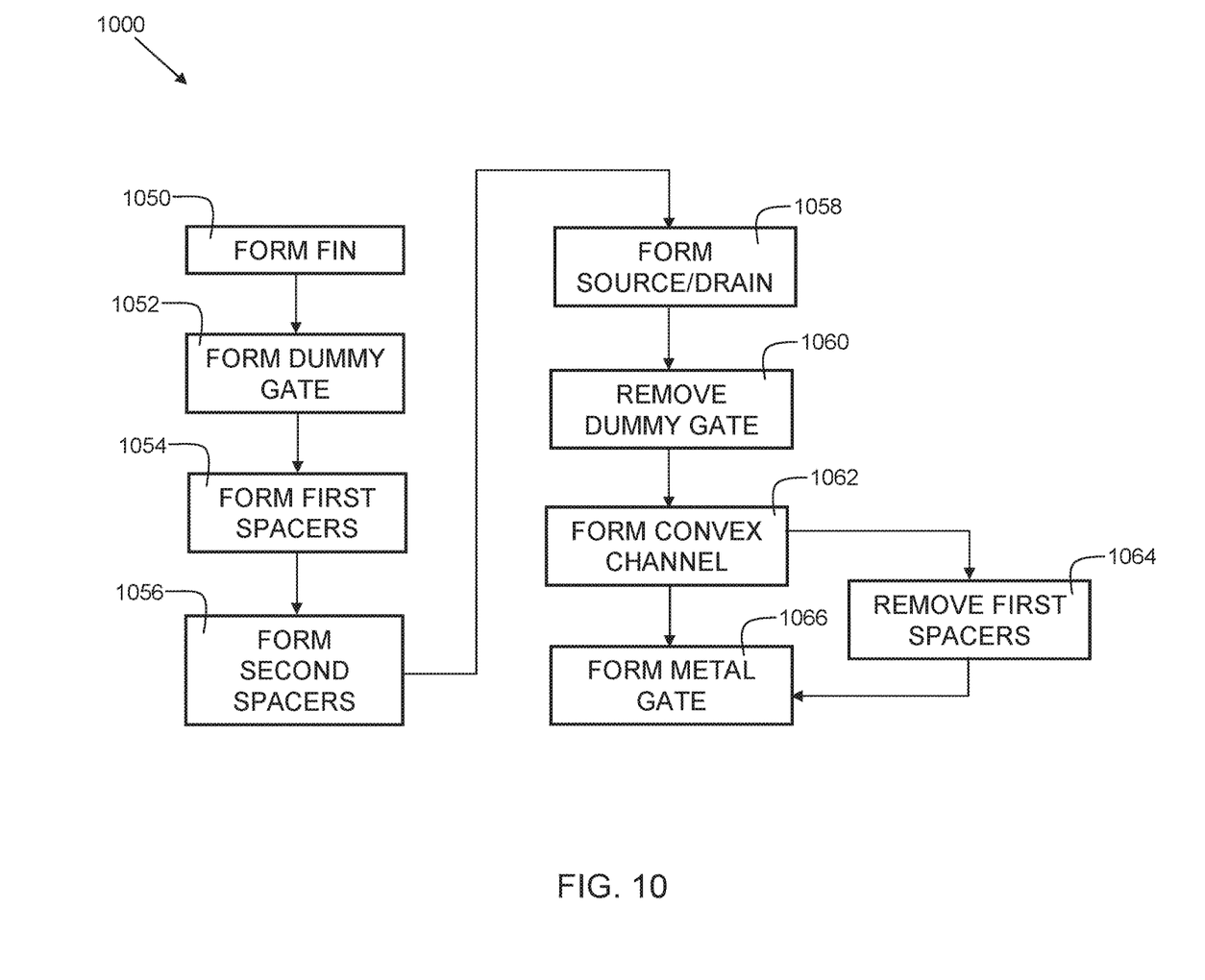
FIG. 10 is a flowchart indicating process steps for embodiments of the present invention.

FIG. 10 is a flowchart 1000 indicating process steps for embodiments of the present invention. In process step 1050, a fin is formed. In embodiments, a sidewall image transfer (SIT) process may be used to form the fin. In process step 1052, a dummy gate is formed (see 725 of FIG. 7). In process step 1054, first spacers are formed (see 728 of FIG. 7). In process step 1056, second spacers are formed (see 726 of FIG. 7). In process step 1058, source/drain regions are formed (see 720 of FIG. 7). In process step 1060, the dummy (sacrificial) gate is removed (see 800 of FIG. 8). In process step 1062, the convex channel region is formed (see 234 of FIG. 2). In process step 1064, optionally, the first spacers are removed (see 900 of FIG. 9). In process step 1066, the metal gate is formed. If the process flow goes from 1062 directly to 1066, the resulting structure appears as shown in FIGS. 2-4. If the process flow uses the alternative path of 1062 to 1064 to 1066, then the resulting structure appears as shown in FIGS. 5-6, with the wrap-around metal gate.

As can now be appreciated, embodiments of the present invention provide improved methods and structures for fabricating finFET-based ZRAM devices comprising convex channels, which are compatible with replacement metal gate processes. Embodiments may use either an N-type finFET or a P-type finFET. Some embodiments may comprise one fin per memory cell. Other embodiments may use multiple fins per memory cell. For example, in one embodiment, three fins per memory cell are used. Using multiple fins per memory cell can serve to reduce device variability.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A method of forming a semiconductor structure, the method comprising:
    forming a semiconductor substrate;
    forming a semiconductor fin on the semiconductor substrate, the semiconductor fin comprising a channel region, the channel region comprising:
        a finned channel portion; and
        a convex channel portion disposed around the finned channel portion, the convex channel portion comprising an inner surface, an elongated surface, and a short surface, the inner surface in direct contact with the finned channel portion, the inner surface further directly contacting the short surface and directly opposite the elongated surface;
    forming a metal gate around the elongated surface of the channel region, wherein a gate dielectric layer is disposed on the metal gate;
    forming a source or drain region on opposite sidewalls of the finned channel portion, a surface of the source or drain region contacting the inner surface of the convex channel portion;
    forming an oxide interlayer between the gate dielectric layer and the channel region, the oxide interlayer configured and disposed to surround both the elongated surface and the short surface of the convex channel portion, a portion of the oxide interlayer positioned on the surface of the source or drain region; and
    forming a spacer disposed adjacent to the metal gate and in direct physical contact with the oxide interlayer, wherein the metal gate and the gate dielectric layer extend between the spacer and the short surface of the convex channel portion;
    wherein the metal gate extends below a top surface of the oxide interlayer.

2. The method of claim 1, wherein the finned channel portion is comprised of a different semiconductor material than the convex channel portion.

3. The method of claim 2, wherein the finned channel portion comprises silicon.

4. The method of claim 3, wherein the convex channel portion comprises germanium.

5. The method of claim 1, wherein the convex channel portion comprises indium.

6. The method of claim 1, wherein the convex channel portion comprises silicon.

7. The method of claim 6, wherein the finned channel portion comprises indium.

8. The method of claim 6, wherein the finned channel portion comprises gallium.

* * * * *